United States Patent
Kim et al.

(10) Patent No.: US 10,861,518 B2
(45) Date of Patent: Dec. 8, 2020

(54) DELAY CONTROL CIRCUIT AND MEMORY DEVICE HAVING THE SAME

(71) Applicant: SK hynix Inc., Icheon-si (KR)

(72) Inventors: Dong Hyun Kim, Icheon-si (KR); Kwan Su Shon, Guri-si (KR); Jin Ha Hwang, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/657,196

(22) Filed: Oct. 18, 2019

(65) Prior Publication Data

US 2020/0321039 A1 Oct. 8, 2020

(30) Foreign Application Priority Data

Apr. 2, 2019 (KR) .................. 10-2019-0038711

(51) Int. Cl.
  *G11C 7/22* (2006.01)
  *G11C 7/10* (2006.01)
(52) U.S. Cl.
  CPC ............ *G11C 7/222* (2013.01); *G11C 7/1051* (2013.01)
(58) Field of Classification Search
  CPC .............................. G11C 7/222; G11C 7/1051
  USPC .................................................... 365/189.15
  See application file for complete search history.

(56) References Cited

U.S. PATENT DOCUMENTS

| 10,218,343 | B1* | 2/2019 | Tomar | ................. | H03K 5/1565 |
| 10,431,293 | B1* | 10/2019 | Takahashi | ........... | G11C 11/4096 |
| 2017/0012638 | A1* | 1/2017 | Furuta | ...................... | H04B 1/16 |

FOREIGN PATENT DOCUMENTS

KR 1020160065516 A 6/2016

* cited by examiner

*Primary Examiner* — Fernando Hidalgo
(74) *Attorney, Agent, or Firm* — William Park & Associates Ltd.

(57) ABSTRACT

A delay control circuit, which may be included in a memory device, includes a delayed signal generator configured to generate an output signal by delaying an input signal in response to a delay control signal and a delay information generator configured to generate delay information indicating an output delay between the input signal and the output signal. The delay control circuit also includes a delay control signal generator configured to, based on a result of a comparison between target delay information indicating a target delay between the input signal and the output signal and based on the delay information, generate the delay control signal for controlling the output delay and fix the output delay at the target delay in response to the delay control signal.

23 Claims, 10 Drawing Sheets

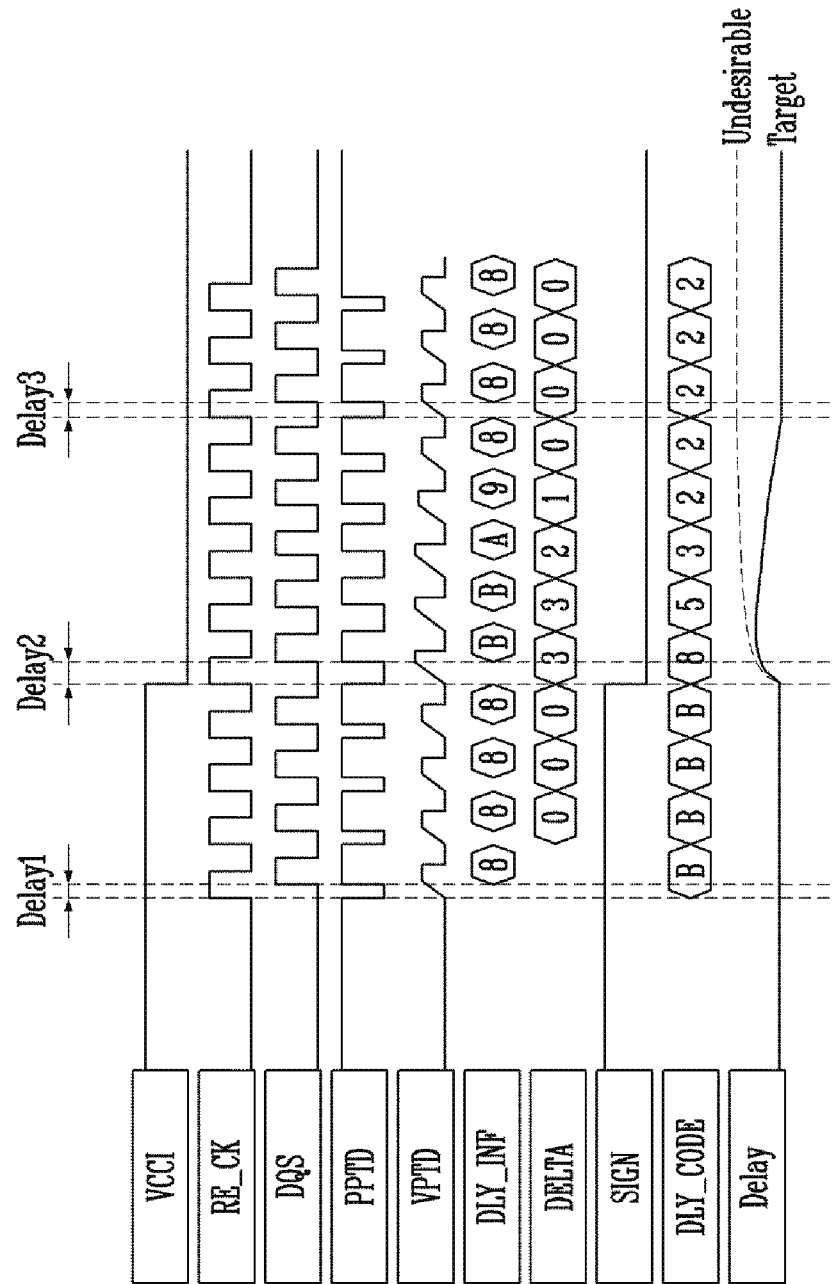

US 10,861,518 B2

DELAY CONTROL CIRCUIT AND MEMORY DEVICE HAVING THE SAME

CROSS-REFERENCE TO RELATED APPLICATION

The present application claims priority under 35 U.S.C. § 119(a) to Korean patent application number 10-2019-0038711 filed on Apr. 2, 2019, in the Korean Intellectual Property Office, the entire disclosure of which is incorporated herein by reference.

BACKGROUND

1. Technical Field

Various embodiments of the present disclosure generally relate to an electronic device, and more particularly, to a delay control circuit and a memory device having the delay control circuit.

2. Related Art

A storage device is a device which stores data under the control of a host device, such as a computer or a smartphone. The storage device may include a memory device in which data is stored and a memory controller which controls the memory device. Such memory devices are classified as volatile memory devices or nonvolatile memory devices.

The volatile memory device is a memory device in which data is stored only when power is supplied and in which stored data is lost when the supply of power is interrupted. Examples of the volatile memory device include a Static Random Access Memory (SRAM) and a Dynamic Random Access Memory (DRAM).

Nonvolatile memory devices retain data even when the supply of power is interrupted. Examples of nonvolatile memory devices include a Read Only Memory (ROM), a Programmable ROM (PROM), an Electrically Programmable ROM (EPROM), an Electrically Erasable and Programmable ROM (EEPROM), and a flash memory.

SUMMARY

Various embodiments of the present disclosure are directed to a delay control circuit having an improved delay control function. In a number of embodiments, the delay control circuit is included in a memory device.

An embodiment of the present disclosure provides for a delay control circuit. The delay control circuit may include a delayed signal generator configured to generate an output signal by delaying an input signal in response to a delay control signal and a delay information generator configured to generate delay information indicating an output delay between the input signal and the output signal. The delay control circuit may also include a delay control signal generator configured to, based on a result of a comparison between target delay information indicating a target delay between the input signal and the output signal and based on the delay information, generate the delay control signal for controlling the output delay and fix the output delay at the target delay in response to the delay control signal.

An embodiment of the present disclosure provides for a memory device. The memory device may include a memory cell array including a plurality of memory cells configured to store data and a peripheral circuit configured to perform a read operation on the memory cells to read the stored data. The memory device may also include a data input/output circuit configured to output the data in response to an internal clock, wherein the data input/output circuit comprises a delay control circuit. The delay control circuit may be configured to generate the internal clock by delaying an external clock that is input to the delay control circuit during the read operation and to fix an output delay between the external clock and the internal clock at a target delay by controlling the output delay.

An embodiment of the present disclosure provides for a method performed by a delay control circuit for fixing a delay between an output clock signal and an input clock signal without using a reference clock signal. The method includes receiving the input clock signal, wherein the input clock signal is not continuously provided to the delay control circuit while the delay control circuit is powered, and generating the output clock signal by delaying the input clock signal based on a delay control signal. The method also includes generating delay information, from the output clock signal and the input clock signal, indicating the delay between the output clock signal and the input clock signal. The method further includes determining target delay information from the delay information at a first time and determining present delay information from the delay information after the first time. The method additionally includes generating the delay control signal based on comparing the present delay information to the target delay information.

BRIEF DESCRIPTION OF THE DRAWINGS

FIG. 13 is a second timing diagram for explaining the operation of the delay control circuit of FIG. 8.

DETAILED DESCRIPTION

Figure 1:
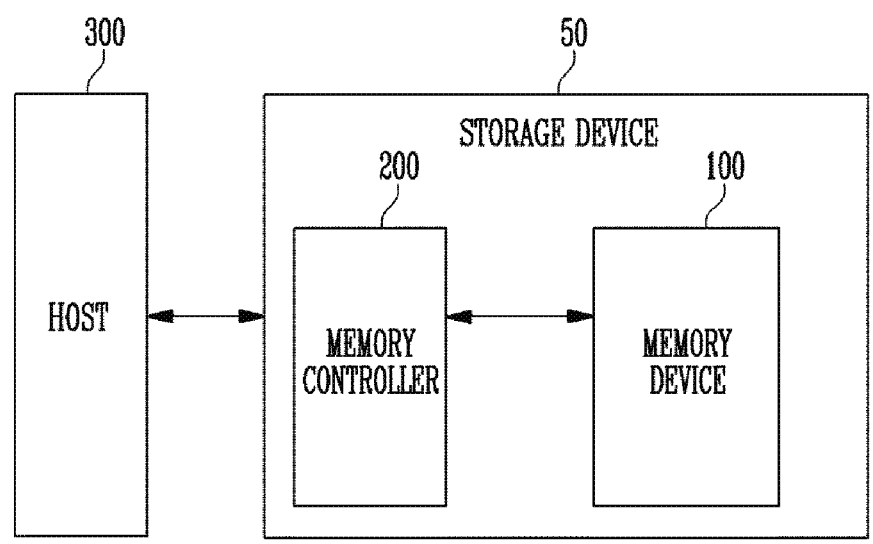
FIG. 1 is a diagram illustrating a storage device according to an embodiment of the present disclosure.

Specific structural or functional descriptions in the embodiments of the present disclosure introduced in this specification or application are for description of the embodiments of the present disclosure. The descriptions should not be construed as being limited to the embodiments described in the specification or application.

The present disclosure is described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure are now described more fully hereinafter with reference to the accompanying drawings, in which embodiments of the present disclosure are illustrated, so that those of ordinary skill in the art can easily carry out the technical idea of the present disclosure.

FIG. 1 is a diagram illustrating a storage device 50 according to an embodiment of the present disclosure.

Referring to FIG. 1, the storage device 50 may include a memory device 100 and a memory controller 200 which controls the operation of the memory device 100. The storage device 50 may store data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a communication scheme with the host 300. The storage device 50 may be implemented as any one of various types of storage devices, for example: a solid state drive (SSD), a multimedia card, such as an MMC, an embedded MMC (eMMC), a reduced size MMC (RS-MMC), or a micro-MMC; a secure digital card, such as an SD, a mini-SD, or a micro-SD; a universal storage bus (USB) storage device; a universal flash storage (UFS) device; a personal computer memory card international association (PCMCIA) card-type storage device; a peripheral component interconnection (PCI)-card type storage device; a PCI express (PCI-E) card-type storage device; a compact flash (CF) card; a smart media card; and a memory stick.

The storage device 50 may be manufactured in any one of various types of package forms. For example, the storage device 50 may be manufactured as a package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased.

In different embodiments, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present disclosure, for convenience of description, a description is provided with the assumption that the memory device 100 is a NAND flash memory.

The memory device 100 may receive a command and an address from the memory controller 200, and may access the area of the memory cell array selected by the address. That is, the memory device 100 may perform an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory controller 200 controls the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored.

The memory controller 200 may control the memory device 100 so that a program operation, a read operation, or an erase operation is performed in response to a request received from the host 300. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a program command, an address, and data regardless of whether a request from the host 300 is received, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control two or more memory devices. In this case, the memory controller 200 may control the two or more memory devices using an interleaving scheme to improve operating performance. The interleaving scheme may be an operating manner in which the operating periods of the two or more memory devices overlap each other.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
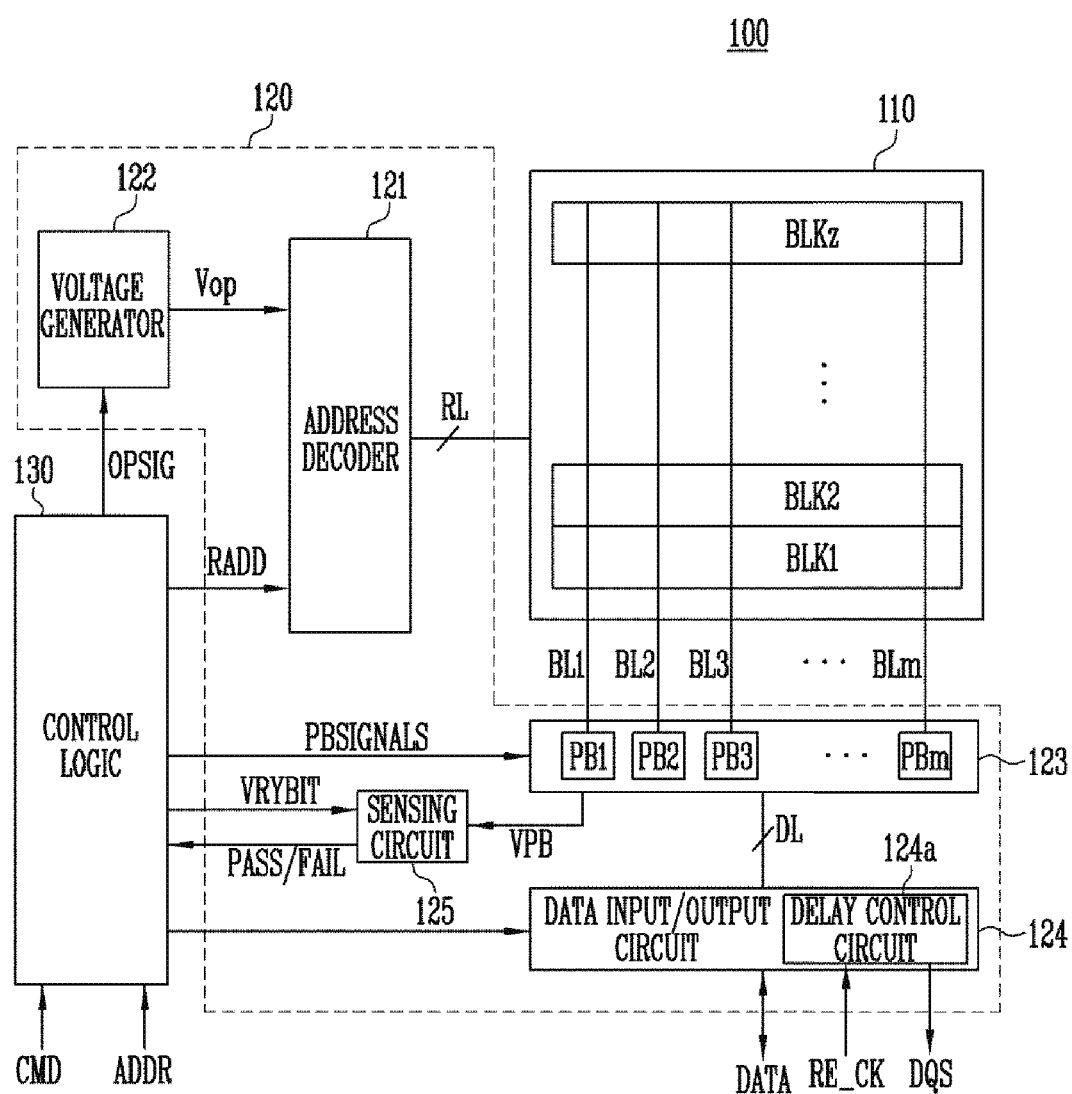
FIG. 2 is a diagram illustrating the structure of a memory device of FIG. 1.

FIG. 2 is a diagram illustrating the structure of the memory device 100 of FIG. 1.

The memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single physical page. That is, the memory cell array 110 is composed of a plurality of physical pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and the memory cells and between a source select transistor and the memory cells.

Each of the memory cells of the memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

In an embodiment, the row lines RL may be local lines included in local line groups. A local line group may correspond to a single memory block. The local line group may include a drain select line, local word lines, and a source select line.

The address decoder 121 may be operated under the control of the control logic 130. The address decoder 121 receives addresses ADDR from the control logic 130.

The address decoder 121 may decode a block address among the received addresses ADDR. The address decoder 121 selects at least one memory block from among the memory blocks BLK1 to BLKz in response to the decoded block address. The address decoder 121 is configured to decode a row address RADD among the received addresses ADDR. The address decoder 121 may select at least one word line of the selected memory block by applying voltages supplied from the voltage generator 122 to at least one word line WL in response to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In accordance with an embodiment of the present disclosure, the erase operation of the memory device 100 may be performed on a memory block basis. During an erase operation, the addresses ADDR input to the memory device 100 include a block address. The address decoder 121 may decode the block address and select a single memory block in response to the decoded block address. During the erase operation, the address decoder 121 may apply a ground voltage to word lines coupled to the selected memory block.

In accordance with an embodiment of the present disclosure, the address decoder 121 may decode a column address among the received addresses ADDR. The decoded column address may be transferred to the read and write circuit 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

In an embodiment, the data input/output circuit 124 may generate an internal clock DQS based on an external clock RE_CK received from the external controller during a read operation. During the read operation, the data input/output circuit 124 may output data stored in the plurality of input/output buffers to the external controller in response to the internal clock DQS. An external clock and an internal clock are also referred to herein as an input clock signal and an output clock signal, respectively.

In an embodiment, the data input/output circuit 124 may include a delay control circuit 124a.

The delay control circuit 124a may generate the internal clock DQS by delaying the received external clock RE_CK. The delay control circuit 124a may control an output delay between the external clock RE_CK and the internal clock DQS so that the output delay is fixed at a target delay.

The delay control circuit 124a may set an initial delay as the target delay. The initial delay may be a delay between the external clock RE_CK, which is initially input during a read operation, and the internal clock DQS, which is initially generated based on the external clock RE_CK, after the storage device has booted up.

In other embodiments, the delay control circuit 124a may set a preset delay as the target delay.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device.

The control circuit 130 may control the peripheral circuit 120 by generating various types of signals in response to the command CMD and the addresses ADDR. For example, the control logic 130 may generate an operation signal OPSIG, a row address RADD, a page buffer control signal PBSIGNALS, and an enable bit VRYBIT in response to the command CMD and the addresses ADDR. The control logic 130 may output the operation signal OPSIG to the voltage generator 122, output the row address RADD to the address decoder 121, output the page buffer control signal PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

Figure 3:
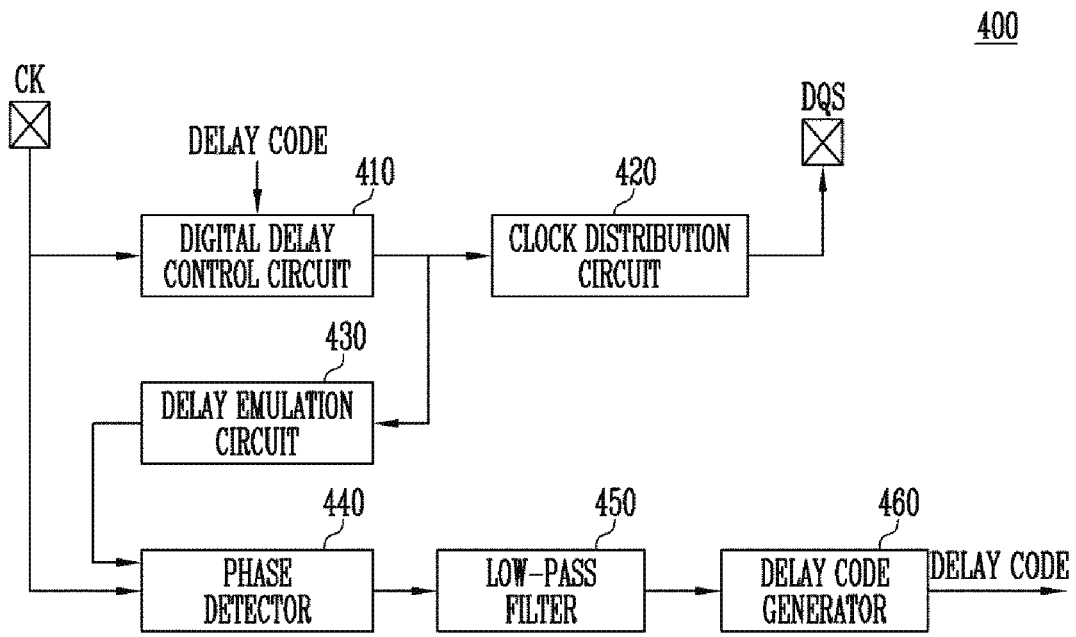
FIG. 3 is a diagram illustrating a delay control circuit according to a first embodiment.

FIG. 3 is a diagram illustrating a delay control circuit according to a first embodiment.

Referring to FIG. 3, a delay control circuit 400 may generate an internal clock DQS based on a reference clock CK, and may output the internal clock DQS to an external device. The reference clock CK may be an input signal that is applied to the delay control circuit 400. The internal clock DQS may be an output signal that is output from the delay control circuit 400. The reference clock CK may be a pulse signal that is regularly applied to perform the operation of a memory device.

In an embodiment, the delay control circuit 400 may include a digital delay control circuit 410, a clock distribution circuit 420, a delay emulation circuit 430, a phase detector 440, a low-pass filter 450, and a delay code generator 460.

The digital delay control circuit 410 may generate a delayed signal by delaying the input signal. The digital delay control circuit 410 may control a degree to which the input signal is to be delayed in response to a delay code that is a digital signal. The digital delay control circuit 410 may output the generated delayed signal to the clock distribution circuit 420 and the delay emulation circuit 430.

The clock distribution circuit 420 may include a clock distribution network (CDN). The clock distribution network may be a system for distributing the same clock to a plurality of target circuits (not illustrated). In other words, the clock distribution network may include a configuration which distributes the input clock to individual target circuits and reduces the differences between respective clocks distributed to the target circuits.

The clock distribution circuit 420 may distribute the delayed signal received from the digital delay control circuit 410. The clock distribution circuit 420 may output the distributed delayed signal as the output signal.

The delay emulation circuit 430 may emulate the degree of a delay until the signal input to the clock distribution circuit 420 is output. In other words, the delay emulation circuit 430 may emulate (copy) an output delay between the delayed signal and the output signal. Therefore, the delay emulation circuit 430 may output a signal having the same delay as the delayed signal (i.e., output signal) that is distributed by the clock distribution circuit 420.

The delay emulation circuit 430 may be utilized to provide, instead of the output signal that is output from the clock distribution circuit 420, the signal having the same delay as the output signal to the phase detector 440.

The phase detector 440 may detect a phase difference between the input signal and the output signal provided from the delay emulation circuit 430. That is, the phase detector 440 may detect the degree (i.e., delay degree) to which the output signal is delayed from the input signal by means of the phase difference. The phase detector 440 may detect an output delay between the input signal and the output signal, generate a delay detection signal, and then provide the delay detection signal to the low-pass filter 450.

The low-pass filter 450 may pass only a low-frequency component, among the components of the delay detection signal, therethrough. The low-pass filter 450 may be used to convert an analog signal into a digital signal.

The delay code generator 460 may generate a delay code based on the delay detection signal having passed through the low-pass filter 450. The delay code may be a delay control signal for controlling the output delay between the input signal and the output signal. The delay code generator 460 may provide the generated delay code to the digital delay control circuit 410.

In FIG. 3, the delay control circuit 400 may be implemented as a negative feedback system configured to detect a delay (i.e., phase difference) between the reference clock CK, which is the input signal, and the internal clock DQS, which is the output signal, and to control a next delay based on the detected delay. Through the delay control circuit 400, the internal clock DQS, which is the output signal, may be synchronized with the reference clock CK, which is the input signal.

Figure 4:
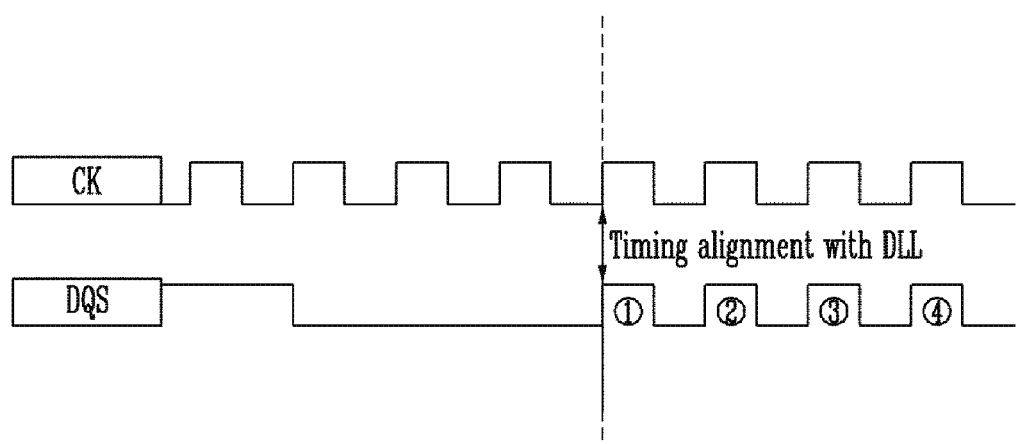
FIG. 4 is a timing diagram for explaining the operation of the delay control circuit of FIG. 3.

FIG. 4 is a timing diagram for explaining the operation of the delay control circuit 400 of FIG. 3.

Referring to FIG. 4, the reference clock CK may be a signal in which the same pulse is regularly repeated. The reference clock CK may be a signal that is continuously provided to a memory device while power is supplied to a storage device.

The delay control circuit, described above with reference to FIG. 3, may be a delay-locked loop (DLL) circuit which fixes a delay between the reference clock CK and the internal clock DQS at "0" by synchronizing the internal clock DQS with the reference clock CK.

The internal clock DQS may be synchronized with the reference clock CK through the delay control circuit. A rising edge of the internal clock DQS synchronized with the reference clock CK may be aligned with a rising edge of the reference clock CK. A falling edge of the internal clock DQS may be aligned with a falling edge of the reference clock CK.

Figure 5:
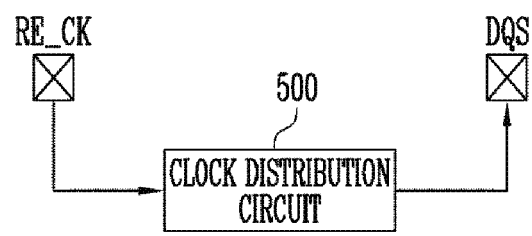
FIG. 5 is a diagram illustrating a clock distribution circuit according to an embodiment.

FIG. 5 is a diagram illustrating a clock distribution circuit 500 according to an embodiment.

Referring to FIG. 5, an input signal that is applied to a clock distribution circuit 500 may be a read clock RE_CK. An output signal that is output from the clock distribution circuit 500 may be an internal clock DQS. The read clock RE_CK, also referred to as a read clock signal, may be a signal that is applied only during a read operation rather than a signal that is always applied to the clock distribution circuit 500. The clock distribution circuit 500 may perform the same function as the clock distribution circuit 420, described above with reference to FIG. 3.

Compared to the embodiment of FIG. 3, a data input/output circuit including the clock distribution circuit 500 does not include a separate circuit component for controlling a delay by detecting an output delay between the read clock RE_CK, which is an input signal, and the internal clock DQS, which is the output signal. Therefore, variation occurring in the read clock RE_CK may influence the internal clock DQS.

Figure 6:
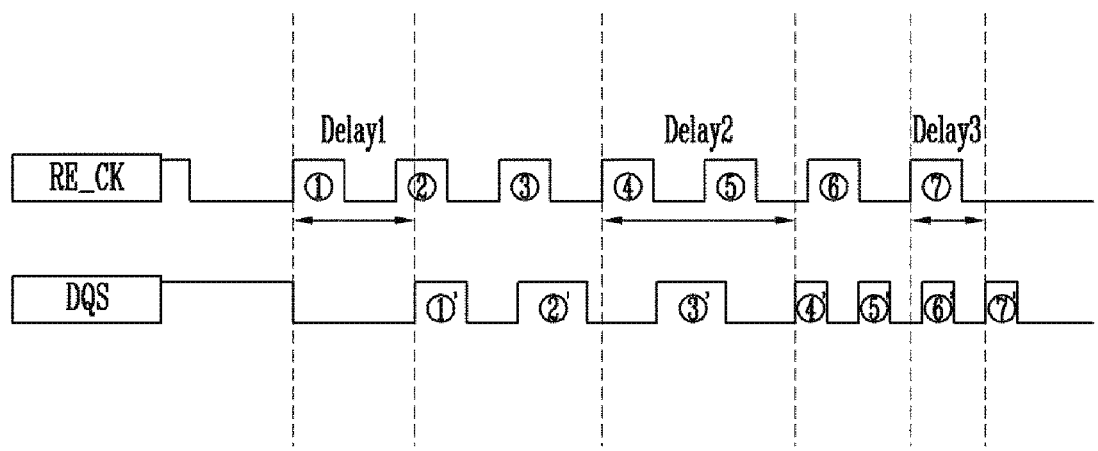
FIG. 6 is a timing diagram for explaining the operation of the clock distribution circuit of FIG. 5.

FIG. 6 is a timing diagram for explaining the operation of the clock distribution circuit 500 of FIG. 5.

Referring to FIG. 6, the read clock RE_CK, which is the input signal, may include pulse signals ① to ⑦. The internal clock DQS, which is the output signal, may include pulse signals ①' to ⑦'. When the component for controlling a delay is not present, as illustrated in FIG. 5, variation occurring in the read clock RE_CK itself or occurring during a signal transfer procedure of the clock distribution circuit 500 may influence the internal clock DQS.

A description is made on the assumption that variation in the read clock RE_CK itself is not present, but variation occurs in the signal transfer procedure of the clock distribution circuit 500. In this case, as illustrated in FIG. 6, the internal clock DQS may be output in the form of pulse signals having non-uniform widths.

A jitter between the first pulse ① of the read clock RE_CK and the first pulse ①' of the internal clock DQS is shown as a first delay Delay1. A jitter between the fourth pulse ④ of the read clock RE_CK and the fourth pulse ④' of the internal clock DQS is shown as a second delay Delay2. A jitter between the seventh pulse ⑦ of the read clock RE_CK and the seventh pulse ⑦' of the internal clock DQS is shown as a third delay Delay3.

The data input/output circuit may output data stored in an input/output buffer to the outside of the memory device in response to the internal clock DQS. The first to third delays Delay1 to Delay3 have different values without being fixed at a single value. Therefore, because the data input/output circuit outputs data in response to the internal clock DQS having irregular pulse signals, a data valid window (tDVW) may be reduced.

Figure 7:
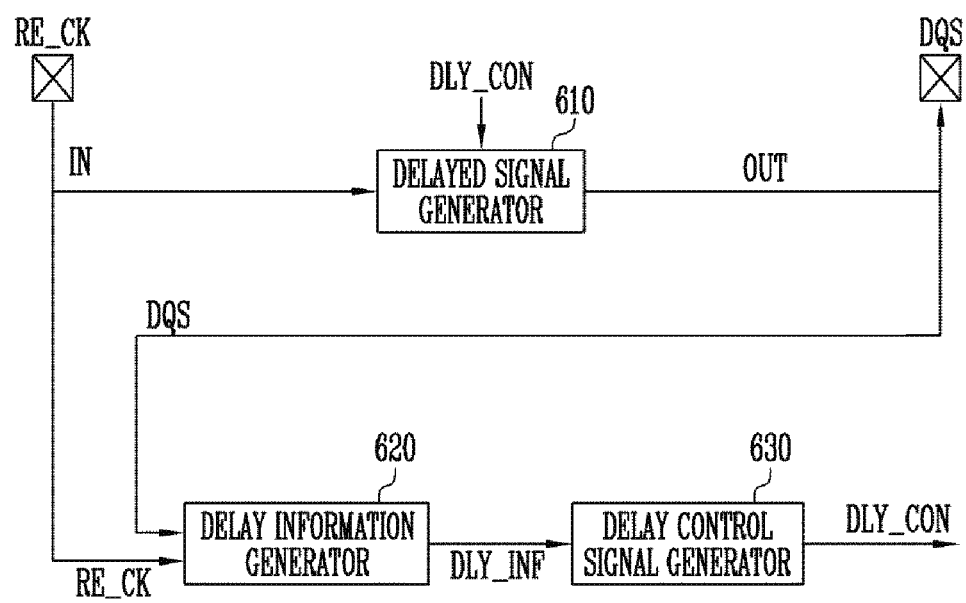
FIG. 7 is a diagram illustrating a delay control circuit according to a second embodiment.

FIG. 7 is a diagram illustrating a delay control circuit 600 according to a second embodiment.

Referring to FIG. 7, the delay control circuit 600 may generate an internal clock DQS based on a read clock RE_CK, and may output the internal clock to an external device. The read clock RE_CK may be an input signal that is applied to the delay control circuit 600. The internal clock DQS may be an output signal that is output from the delay control circuit 600. The read clock RE_CK may be a pulse signal that is applied only during a read operation.

That is, the read clock RE_CK is not a pulse signal that is always provided to a memory device, unlike a reference clock CK. Therefore, a method of controlling the delay of the output signal by synchronizing the internal clock DQS with the read clock RE_CK using the configuration of FIG. 3 may be inefficient.

The delay control circuit 600 may control the delay using a scheme for fixing the output delay between the input signal and the output signal at a target delay, unlike the delay control circuit 400 of FIG. 3.

That is, the delay control circuit 600 may provide the output signal in the form of pulse signals having a uniform width by fixing the output delay between the input signal and the output signal at the target delay having a value greater than 0. The delay control circuit 600 may stably output the internal clock DQS in the form of pulse signals having a uniform width, thus improving the data valid window (tDVW).

The delay control circuit 600 may include a delayed signal generator 610, a delay information generator 620, and a delay control signal generator 630.

The delayed signal generator 610 may receive the read clock RE_CK as an input signal and then generate (output) the internal clock DQS as an output signal. The delayed signal generator 610 may generate the output signal by delaying the input signal in response to a delay control signal DLY_CON. The delayed signal generator 610 may generate the output signal by delaying the input signal by a longer or shorter time interval in response to the delay control signal DLY_CON.

The delay information generator 620 may generate delay information DLY_INF indicating an output delay between the read clock RE_CK, which is the input signal, and the internal clock DQS, which is the output signal. The delay information generator 620 may detect the output delay, which is an analog signal, and may then generate the delay information DLY_INF by converting the detected delay into a digital signal.

The delay control signal generator 630 may generate the delay control signal DLY_CON based on the delay information DLY_INF received from the delay information generator 620.

In detail, the delay control signal generator 630 may generate the delay control signal DLY_CON for controlling the output delay between the read clock RE_CK, which is the input signal, and the internal clock DQS, which is the output signal, so that the output delay is fixed at the target delay.

The delay control signal generator 630 may generate the delay control signal DLY_CON based on the result of a comparison between delay information DLY_INF related to the target delay and delay information DLY_INF related to the detected delay. The delay control signal generator 630 may perform control such that the output delay between the input signal and the output signal is fixed at the target delay in response to the delay control signal DLY_CON. In an embodiment, the delay control signal DLY_CON may include a delay code that is a digital signal.

In an embodiment, the delay control signal generator 630 may set an initial delay as the target delay. The initial delay may be a delay between the external clock RE_CK, which is input to the delayed signal generator 610 during an initial read operation, and the internal clock DQS, which is initially generated based on the external clock RE_CK, after the storage device has booted up.

For example, the initial delay may be a jitter between a first pulse of the initially input external clock RE_CK and a first pulse of the initially generated internal clock DQS. In various embodiments, the initial delay may be any one of the minimum value, the average value, and the maximum value of jitters between the initially input external clock RE_CK and the initially generated internal clock DQS.

In other embodiments, the delay control signal generator 630 may set a preset delay as the target delay.

Figure 8:
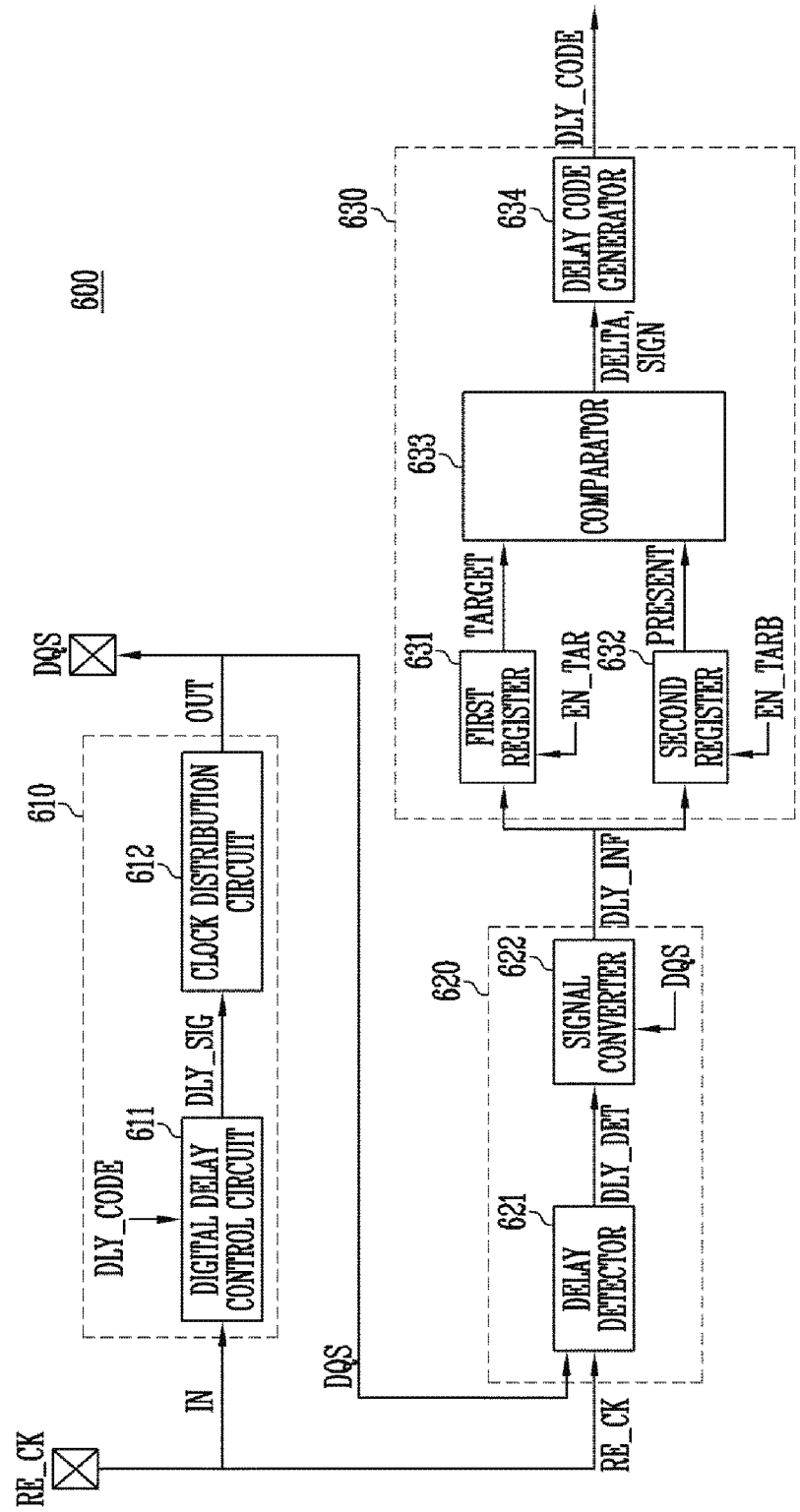
FIG. 8 is a diagram illustrating a detailed configuration of the delay control circuit of FIG. 7.

FIG. 8 is a diagram illustrating a detailed configuration of the delay control circuit 600 of FIG. 7.

Referring to FIG. 8, the delayed signal generator 610 may include a digital delay control circuit 611 and a clock distribution circuit 612.

The digital delay control circuit 611 may generate a delayed signal DLY_SIG by delaying a read clock RE_CK, which is an input signal, in response to a delay code DLY_CODE that is a digital signal. The digital delay control circuit 611 may generate the delayed signal DLY_SIG by changing the degree to which the read clock RE_CK is to be delayed in response to the delay code DLY_CODE. The digital delay control circuit 611 may include a digitally controlled delay line (DCDL) circuit.

The clock distribution circuit 612 may distribute the delayed signal DLY_SIG received from the digital delay control circuit 611. The clock distribution circuit 612 may distribute the delayed signal DLY_SIG and then output the result of distribution as an internal clock DQS, which is an output signal. The clock distribution circuit 612 may perform the same function as the clock distribution circuit, described above with reference to FIGS. 3 and 5.

The delay information generator 620 may include a delay detector 621 and a signal converter 622.

The delay detector 621 may detect an output delay between the read clock RE_CK, which is the input signal, and the internal clock DQS, which is the output signal. The delay detector 621 may detect the output delay and generate a delay detection signal DLY_DET. The delay detection signal DLY_DET may be a signal having a pulse width or a voltage level proportional to the output delay.

The signal converter 622 may generate delay information DLY_INF by converting the delay detection signal DLY_DET, which is an analog signal, into a digital signal in response to the internal clock DQS. In an embodiment, the signal converter 622 may include an analog-to-digital converter (ADC). In various embodiments, the signal converter 622 may include a time-to-digital converter (TDC).

The delay control signal generator 630 may include a first register 631, a second register 632, a comparator 633, and a delay code generator 634.

The first register 631 may store delay information DLY_INF indicating a target delay as target delay information TARGET in response to a first enable signal EN_TAR. The first enable signal EN_TAR might be activated only during an interval in which the target delay information TARGET is stored.

The second register 632 may store delay information DLY_INF, indicating the output delay between the input signal and the output signal, as delay information PRESENT, also referred to as present delay information, in response to a second enable signal EN_TARB. The second enable signal EN_TARB may be a signal obtained by inverting the first enable signal EN_TAR.

In various embodiments, when an initial delay is set as the target delay, the first register 631 may store the delay information DLY_INF indicating the initial delay. The initial delay may be a delay between the read clock RE_CK, which is input during the initial read operation, and the internal clock DQS, which is initially generated, after the storage device has booted up. The first enable signal EN_TAR might be activated only during an interval in which the delay information DLY_INF indicating the initial delay is stored. In this case, until the storage device reboots up, the first register 631 may maintain the delay information DLY_INF indicating the stored initial delay.

Because the second enable signal EN_TARB is an inverted signal of the first enable signal EN_TAR, it may be activated after the interval during which the delay information DLY_INF indicating the initial delay is stored. Whenever delay information PRESENT is newly generated, the second register 632 may update previously stored delay information PRESENT with newly generated delay information PRESENT and then store the updated delay information.

In other embodiments, the first register 631 may store delay information DLY_INF indicating a preset delay as target delay information TARGET.

The comparator 633 may compare the target delay information TARGET received from the first register 631 with the delay information PRESENT received from the second register 632, and may generate the result of the comparison. The comparator 633 may generate, as the result of the comparison, magnitude information DELTA and sign information SIGN of the difference between the target delay information TARGET and the delay information PRESENT.

The delay code generator 634 may generate the delay code DLY_CODE for controlling the output delay between the read clock RE_CK, which is the input signal, and the internal clock DQS, which is the output signal, using the magnitude information DELTA and the sign information SIGN. The delay code generator 634 may generate the delay code DLY_CODE so that the value of the magnitude information DELTA is decreased. As the value of the magnitude information DELTA is decreased, the delay information may have a value closer to the target delay information. In other words, the output delay between the input signal and the output signal approaches the target delay, thus being consequently fixed at the target delay.

Figure 9A:
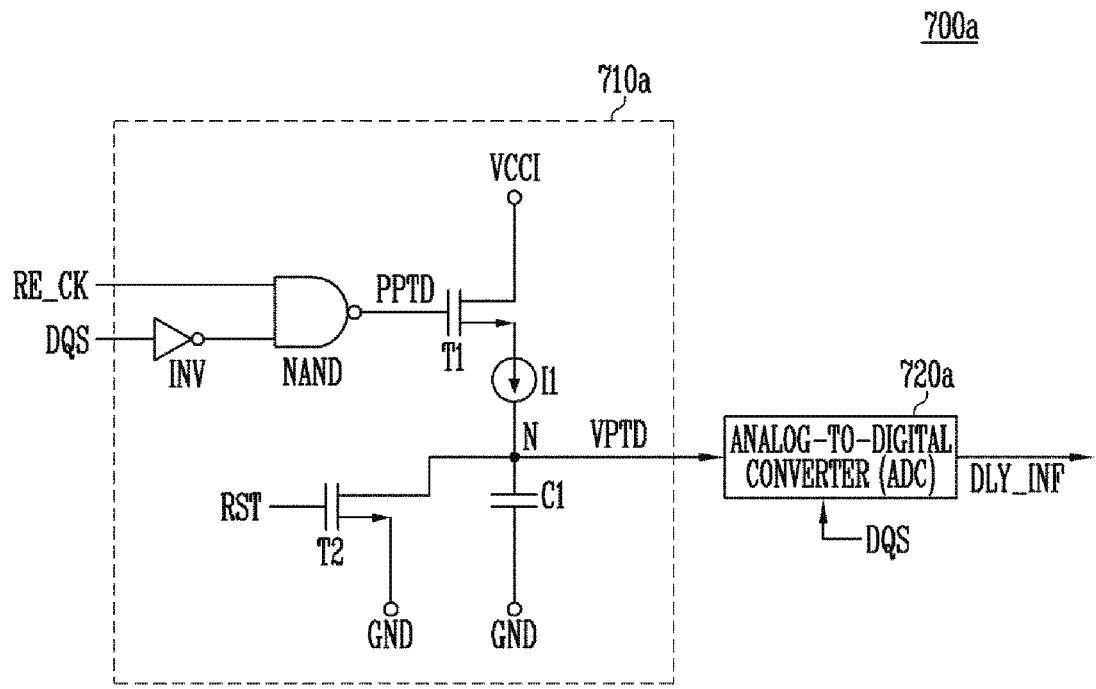
FIG. 9A is a diagram illustrating an embodiment of a delay information generator of FIG. 8.

FIG. 9A is a diagram illustrating an embodiment of a delay information generator 770a. For an embodiment, the delay information generator 770a represents the delay information generator 620 of FIG. 8.

Referring to FIG. 9A, the delay information generator 700a may include a delay detector 710a and a signal converter 720a.

The delay detector 710a may detect a delay, which is an analog signal, and may generate a voltage proportional to delay (VPTD) as a delay detection signal.

In an embodiment, the delay detector 710a may include an inverter INV, a NAND gate, transistors T1 and T2, a capacitor C1, and a current source I1. The transistors may be NMOS transistors.

The read clock RE_CK and the internal clock DQS, having passed through the inverter INV, are input to the NAND gate. The NAND gate may output a pulse signal proportional to the output delay between the read clock RE_CK and the internal clock DQS, that is, a pulse proportional to delay (PPTD) signal. The pulse proportional to delay (PPTD) signal may be applied, as a control signal, to a gate terminal of the transistor T1. A supply voltage source VCCI may be coupled to a drain terminal of the transistor T1 to supply power to the transistor T1.

The current source I1 may be coupled between a source terminal of the transistor T1 and an output node N. The current source I1 may control a voltage charged in the capacitor C1 in response to the pulse proportional to delay (PPTD) signal which is the control signal. As the pulse width of the control signal is wider, a voltage having a higher level may be charged in the capacitor C1. As the pulse width of the control signal is narrower, a voltage having a lower level may be charged in the capacitor C1.

The capacitor C1 may be coupled between the output node N and a ground node GND. The capacitor C1 may store voltages having different magnitudes depending on a current supplied from the current source I1. The voltage charged (stored) in the capacitor C1 may be the voltage proportional to delay (VPTD).

The transistor T2 may be operated under the control of a reset signal RST, and may be coupled between the output node N and the ground node GND. The transistor T2 may form a current path between the output node N and the ground node GND and discharge the voltage charged in the capacitor C1 in response to the reset signal RST.

The delay detector 710a may be composed of various logic circuits and elements (e.g., resistors, capacitors, transistors, amplifiers, etc.) depending on a design scheme.

The signal converter 720a may receive the voltage proportional to delay (VPTD) as a delay detection signal from the delay detector 710a. The signal converter 720a may include an ADC for converting the delay detection signal into a digital signal. The signal converter 720a may convert the delay detection signal into the digital signal in response to the internal clock DQS, and may output the digital signal as delay information DLY_INF.

Figure 9B:
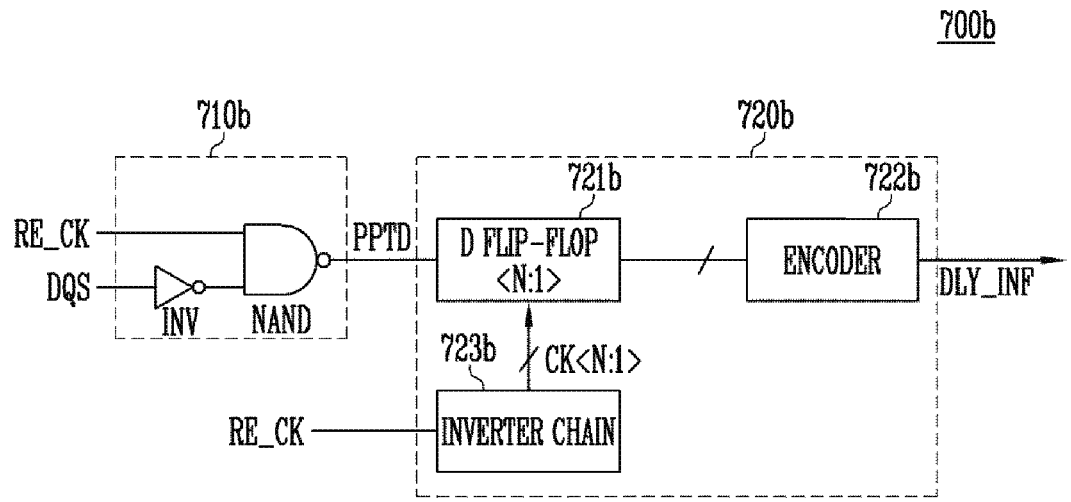
FIG. 9B is a diagram illustrating an embodiment of the delay information generator of FIG. 8.

FIG. 9B is a diagram illustrating an embodiment of a delay information generator 770b. For an embodiment, the delay information generator 770b represents the delay information generator 620 of FIG. 8.

Referring to FIG. 9B, the delay information generator 700b may include a delay detector 710b and a signal converter 720b.

The delay detector 710b may detect a delay, which is an analog signal, and may generate a pulse proportional to delay (PPTD) as a delay detection signal.

In an embodiment, the delay detector 710b may include an inverter INV and a NAND gate. The read clock RE_CK and the internal clock DQS, having passed through the inverter INV, are input to the NAND gate. The NAND gate may output a pulse signal proportional to the output delay (i.e., PPTD) between the read clock RE_CK and the internal clock DQS.

The signal converter 720b may receive the PPTD as a delay detection signal from the delay detector 710b. The signal converter 720b may convert the delay detection signal into a digital signal, and may output the digital signal as delay information DLY_INF.

The signal converter 720b may include a D flip-flip circuit 721b, an encoder 722b, and an inverter chain circuit 723b.

The D flip-flop circuit 721b may store the pulse proportional to delay (PPTD), which is an analog signal, as a digital code by sampling the PPTD N times. In detail, the D flip-flop circuit 721b may include N D flip-flops (D flip-flop<N:1>) for sampling the pulse proportional to delay (PPTD) depending on clock signals CK<N:1> provided by the inverter chain circuit 723b.

The encoder 722b may convert the digital code stored in the D flip-flop circuit 721b into a binary code by encoding the digital code. The encoder 722b may output the converted binary code as the delay information DLY_INF.

The inverter chain circuit 723b may generate the N clock signals CK<N:1> for sampling by delaying the read clock RE_CK at intervals of a predetermined time. The inverter chain circuit 723b may include a plurality of inverters for generating the N clock signals CK<N:1>.

Figure 10A:
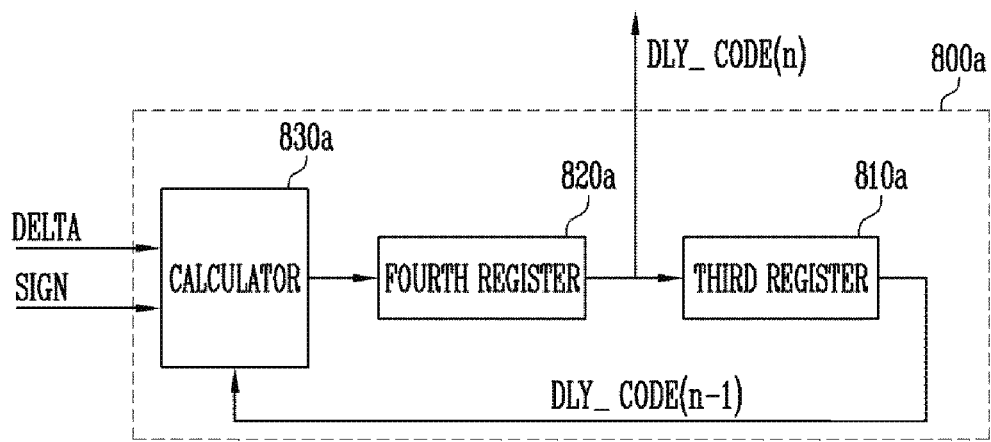
FIG. 10A is a diagram illustrating an embodiment of a delay code generator of FIG. 8.

FIG. 10A is a diagram illustrating an embodiment of a delay code generator 800a. For an embodiment, the delay code generator 800a represents the delay code generator 634 of FIG. 8.

Referring to FIG. 10A, the delay code generator 800a may include a third register 810a, a fourth register 820a, and a calculator 830a.

The third register 810a may store a previous delay code DLY_CODE(n−1). The previous delay code DLY_CODE (n−1) may be a delay code generated immediately before an output delay code DLY_CODE(n) is generated. The third register 810a may receive the previous delay code DLY_CODE(n−1) from the fourth register 820a. The third register 810a may provide the previous delay code DLY_CODE(n−1) to the calculator 830a.

The fourth register 820a may store the output delay code DLY_CODE(n) generated by the calculator 830a. When the output delay code DLY_CODE(n) is output to an external device, the fourth register 820a may provide the output delay code DLY_CODE(n) to the third register 810a.

The calculator 830a may generate the delay code DLY_CODE(n) to reflect the magnitude information DELTA and the sign information SIGN in the previous delay code DLY_CODE(n−1). The magnitude information DELTA and the sign information SIGN may be magnitude information and sign information of the difference between the target delay information and the delay information, which is provided by the comparator, described above with reference to FIG. 8.

The calculator 830a may generate the output delay code DLY_CODE(n) by adding or subtracting the magnitude information DELTA to or from the previous delay code DLY_CODE(n−1) depending on the sign information SIGN.

Figure 10B:
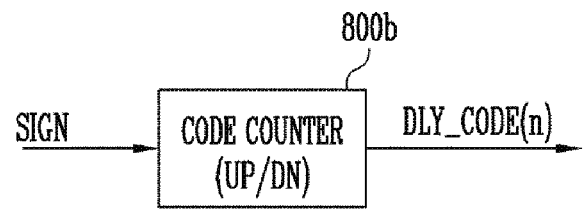
FIG. 10B is a diagram illustrating an embodiment of the delay code generator of FIG. 8.

FIG. 10B is a diagram illustrating an embodiment of a delay code generator 800b. For an embodiment, the delay code generator 800b represents the delay code generator 634 of FIG. 8.

Referring to FIG. 10B, the delay code generator 800b may be implemented as a code counter.

The delay code generator 800b may generate a delay code DLY_CODE(n) by adding or subtracting a preset value to or from a reference code value depending on sign information SIGN provided by the comparator. When the sign information SIGN indicates a plus (positive) sign, the delay code generator 800b may generate the delay code DLY_CODE(n) by adding the preset value to the reference code value. When the sign information SIGN indicates a minus (negative) sign, the delay code generator 800b may generate the delay code DLY_CODE(n) by subtracting the preset value from the reference code value.

Depending on the design scheme, the delay code generator 800b may generate the delay code DLY_CODE(n) to reflect the preset value in the reference code value using a sign opposite to the sign indicated by the sign information SIGN.

Figure 11:
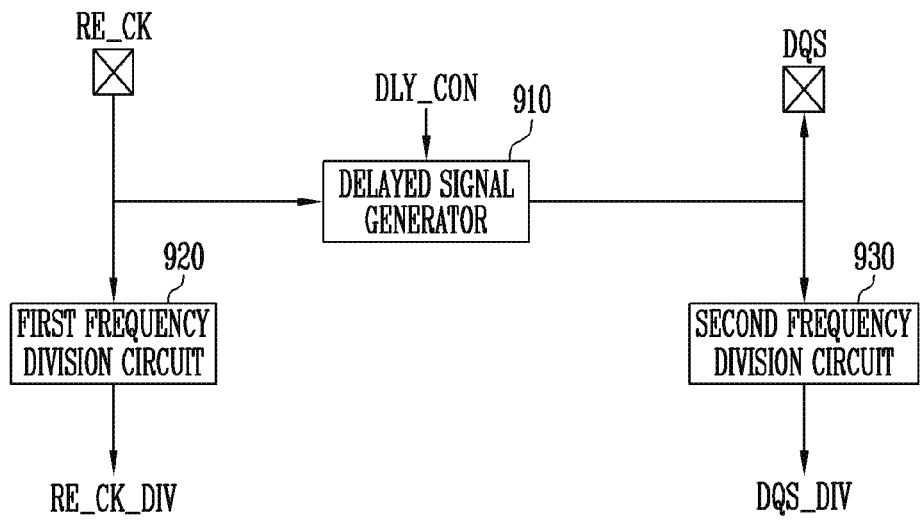
FIG. 11 is a diagram for explaining a frequency-divided external clock and a frequency-divided internal clock.

FIG. 11 is a diagram for explaining a frequency-divided external clock and a frequency-divided internal clock.

Referring to FIG. 11, a delayed signal generator 910 may receive a read clock RE_CK that is an external clock. The delayed signal generator 910 may generate an internal clock DQS by delaying the read clock RE_CK in response to a delay control signal DLY_CON.

A first frequency division circuit 920 may generate a frequency-divided read clock RE_CK_DIV by frequency-dividing the received read clock RE_CK by a multiple of an integer. The frequency-divided read clock RE_CK_DIV may be output as a pulse signal at a speed lower than that of the read clock RE_CK.

A second frequency division circuit 930 may generate a frequency-divided internal clock DQS_DIV by frequency-dividing the received internal clock DQS. The frequency-divided internal clock DQS_DIV may be output as a pulse signal at a speed lower than that of the internal clock DQS.

In an embodiment, instead of the read clock RE_CK and the internal clock DQS, the frequency-divided read clock RE_CK_DIV and the frequency-divided internal clock DQS_DIV may be applied to the delay information generator 620, described above with reference to FIG. 7. Because the frequency-divided read clock RE_CK_DIV and the frequency-divided internal clock DQS_DIV are frequency-divided by a multiple of the same integer, the delay information generator 620 may generate the same delay information DLY_INF in the same way as for the input of the read clock RE_CK and the internal clock DQS.

There is an advantage in that, when, instead of the read clock RE_CK and the internal clock DQS, the frequency-divided read clock RE_CK_DIV and the frequency-divided internal clock DQS_DIV are input to the delay information generator 620, the delay information generator 620 operating at low speed may also generate the same delay information DLY_INF.

Figure 12:
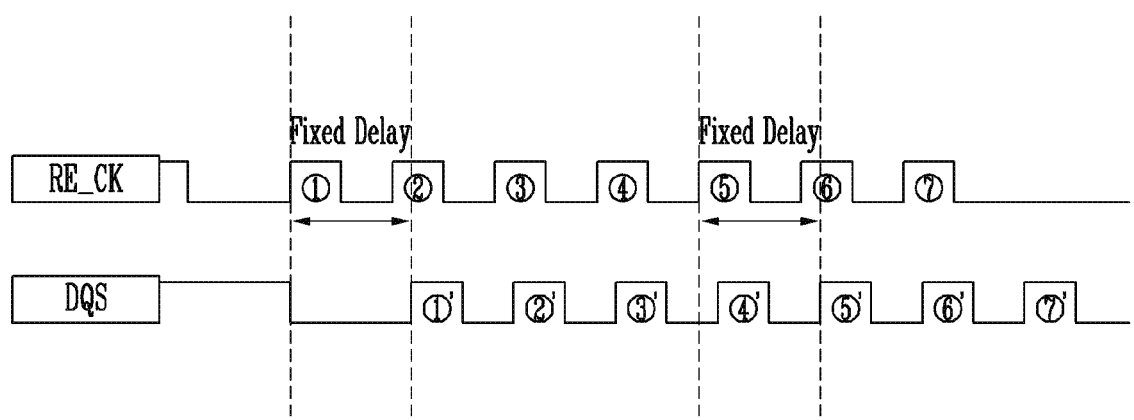
FIG. 12 is a first timing diagram for explaining the operation of the delay control circuit of FIG. 8.

FIG. 12 is a first timing diagram for explaining the operation of the delay control circuit 600 of FIG. 8.

Referring to FIG. 12, an output delay between a read clock RE_CK, which is an input signal, and an internal clock DQS, which is an output signal, may be fixed at a target delay. A preset delay or an initial delay may be set as the target delay.

In FIG. 12, the initial delay may be set as the target delay.

The initial delay may be an output delay between a read clock RE_CK, which is input during an initial read operation, and an internal clock DQS, which is initially generated, after a storage device has booted up. In detail, the initial delay may be a jitter between a first pulse ① of the initially input read clock RE_CK and a first pulse ①' of the initially output internal clock DQS.

When the initial delay is set as the target delay, the internal clock DQS may be output in the form of pulse signals having a uniform width even if variation occurs in the read clock RE_CK itself or in a signal transfer procedure of a clock distribution circuit 612. In other words, in spite of such variation, the internal clock DQS may be output in the form of stable pulse signals having a uniform width, thus improving a data valid window (tDVW).

Compared to the embodiment of FIG. 6, the internal clock DQS may be output while having a fixed delay from the read clock RE_CK.

Therefore, respective pulses of the read clock RE_CK and of the internal clock DQS at identical sequential positions have an identical jitter. For example, jitter in a fifth pulse ⑤' of the internal clock DQS with respect to the read clock RE_CK may be identical to jitter in a first pulse ①' of the internal clock DQS.

FIG. 13 is a second timing diagram for explaining the operation of the delay control circuit 600 of FIG. 8.

Referring to FIG. 13, a description is made on the assumption that variation occurs in the supply of a power supply voltage VCCI.

A read clock RE_CK may be a pulse signal that is input to a delay control circuit during a read operation.

An internal clock DQS may be an output signal that is generated by the delay control circuit delaying the read clock RE_CK.

A pulse proportional to delay (PPTD) may be a signal, a pulse width of which is proportional to an output delay between the read clock RE_CK and the internal clock DQS. As the output delay is longer, a pulse having a low level may be output for a longer time. As the output delay is shorter, a pulse having a low level may be output for a shorter time. In other embodiments, as the output delay is longer, a pulse having a high level may be output for a longer time. As the output delay is shorter, a pulse having a high level may be output for a shorter time.

A voltage proportional to delay (VPTD) may be a signal, the voltage level of which is proportional to the output delay between the read clock RE_CK and the internal clock DQS. As the output delay is longer, a positive voltage having a higher level may be output. As the output delay is shorter, a positive voltage having a lower level may be output. In other embodiments, as the output delay is longer, a negative voltage having a higher level may be output. As the output delay is shorter, a negative voltage having a lower level may be output.

The delay information DLY_INF may be a digital code in which a delay detection signal, which is an analog signal, is converted into a digital signal. The delay detection signal may include at least one of a pulse proportional to delay (PPTD) and a voltage proportional to delay (VPTD).

Magnitude information DELTA and sign information SIGN may be the result of a comparison related to the difference between target delay information and delay information.

In an embodiment, when the sign information SIGN is a high level, it may indicate a plus (positive) sign. When the sign information SIGN is a low level, it may indicate a minus (negative) sign. Depending on various designs, when the sign information SIGN is a low level, it may indicate a plus sign, whereas when the sign information SIGN is a high level, it may indicate a minus sign.

When the output delay becomes greater than the target delay, there is a need to decrease the output delay so that the output delay is fixed at the target delay. Therefore, in this case, the sign information SIGN may indicate a minus sign. In contrast, when the output delay becomes less than the target delay, there is a need to increase the output delay so that the output delay is fixed at the target delay. Therefore, in this case, the sign information SIGN may indicate a plus sign.

The magnitude information DELTA may indicate the degree to which the output delay itself is increased or decreased from the target delay. As the difference between the output delay and the target delay is larger, the magnitude information DELTA may have a larger value. As the difference between the output delay and the target delay is smaller, the magnitude information DELTA may have a smaller value. When the output delay is fixed at the target delay (i.e., when the output delay is identical to the target delay), the magnitude information DELTA may have a value of 0.

The delay code DLY_CODE may be a delay control signal for controlling the output delay. In an embodiment, as the value of the delay code DLY_CODE becomes smaller, the output signal may be generated by delaying the input signal by a shorter time. In contrast, as the value of the delay code DLY_CODE becomes larger, the output signal may be generated by delaying the input signal by a longer time. By means of the above scheme, the output delay between the input signal and the output signal may be controlled.

In FIG. 13, a first delay Delay1 may be an initial delay. Therefore, the first delay Delay1 may be set as the target delay. Here, target delay information indicating the target delay may have a value of '8'.

Until a second delay Delay2 attributable to variation in a supply voltage VCCI is detected, the delay information DLY_INF indicating the detected delay may also have a value of '8'. Therefore, the sign information SIGN of the difference between the delay information and the target delay information may indicate a plus sign, and the magnitude information DELTA related thereto may have a value of '0'.

The delay code DLY_CODE may be generated in correspondence with each pulse signal corresponding to every period. The value of the delay code DLY_CODE for the initial delay may be "B". 'B' represented by a hexadecimal number may be represented by a decimal number of '11'. Until the second delay Delay2 is detected, the delay code DLY_CODE may be maintained at the value of 'B'.

The second delay Delay2 may occur due to variation in the supply voltage VCCI. The second delay Delay2 has a value increased from the first delay Delay1, which is the target delay. Therefore, as the output delay is increased from the first delay Delay1 to the second delay Delay2, the value of the delay information DLY_INF may be increased from '8' to 'B' at a first pulse appearing when the second delay Delay2 occurs.

The difference between '8', which is the value of the target delay information, and 'B', which is the value of the delay information, may be '−3'. Therefore, the magnitude information DELTA may have a value of '3'. The sign information SIGN may indicate a minus sign.

The value of a previous delay code DLY_CODE appearing immediately before the second delay Delay2 occurs may be 'B'. The value of the delay code DLY_CODE in which the magnitude information DELTA and the sign information SIGN are reflected may be '8' in which '−3' is reflected in 'B'.

The value of the delay information DLY_INF at a second pulse appearing after the second delay Delay2 has occurred may be 'B'. The difference between '8', which is the value of the target delay information, and 'B', which is the value of the delay information, may be '−3'. Therefore, the magnitude information DELTA may have a value of '3', and the sign information SIGN may indicate a minus sign. The value of the delay code DLY_CODE may be '5' in which '−3' is reflected in '8'.

The value of the delay information DLY_INF at a third pulse appearing after the second delay Delay2 has occurred may be 'A'. The difference between '8', which is the value of the target delay information, and 'A', which is the value of the delay information, may be '−2'. Therefore, the magnitude information DELTA may have a value of '2', and the sign information SIGN may indicate a minus sign. The value of the delay code DLY_CODE may be '3' in which '−2' is reflected in '5'.

The value of the delay information DLY_INF at a fourth pulse appearing after the second delay Delay2 has occurred may be '9'. The difference between '8', which is the value of the target delay information, and '9', which is the value of the delay information, may be '−1'. Therefore, the magnitude information DELTA may have a value of '1', and the sign information SIGN may indicate a minus sign. The value of the delay code DLY_CODE may be '2' in which '−1' is reflected in '3'.

The value of the delay information DLY_INF at a fifth pulse appearing after the second delay Delay2 has occurred may be '8'. The difference between '8', which is the value of the target delay information, and '8', which is the value of the delay information, may be '0'. Therefore, the magnitude information DELTA may have a value of '0', and the sign information SIGN may indicate a minus sign. This means that the output delay is fixed at the target delay. The value of the delay code DLY_CODE may be '2' in which '0' is reflected in '2'.

At a sixth pulse appearing after the second delay Delay2 has occurred, a delay between the read clock RE_CK and the internal clock DQS may be a third delay Delay3. The third delay Delay3 may be identical to the first delay Delay1, which is the target delay.

The output delay "Delay" has increased from the target level to an undesirable level due to the occurrence of variation in the middle of the operation, and is then re-fixed at the target level.

The embodiment of FIG. 13 is advantageous in that, even if the delay between the read clock RE_CK and the internal clock DQS is changed due to a factor in the read clock RE_CK itself or other factors, the output delay may be re-fixed at the target delay, compared to the embodiment of FIG. 6. When the output delay is fixed at the target delay, the internal clock DQS is output in the form of stable pulse signals having a uniform width, thus improving the data valid window (tDVW). The tDVW is the length of an interval during which data can be effectively sampled, and thus the reliability of sampled data may be further improved as the length of tDVW becomes longer.

Further, compared to the embodiment of FIG. 4, there is an advantage in that, although the input signal is a read clock RE_CK, which is input only during a read operation, rather than a signal that is always input like a reference clock CK, the output delay may be controlled.

In accordance with the present disclosure, there are provided a delay control circuit having an improved delay control function and a memory device having the delay control circuit.

While a limited number of possible embodiments for the present teachings have been disclosed for illustrative purposes, those skilled in the art will appreciate that various modifications, substitutions, additions, and substitutions are possible. Therefore, the scope of the present teachings is not limited to the disclosed embodiments but instead is defined by the appended claims and equivalents thereof.

In the above-discussed embodiments, all steps may be selectively performed or skipped. In addition, the steps in each embodiment might not always be sequentially performed in a given order, and may otherwise or randomly be performed. Furthermore, the embodiments disclosed in the present specification and the drawings aim to help those with ordinary knowledge in the art more clearly understand the present disclosure rather than aiming to limit the bounds of the present disclosure. In other words, one of ordinary skill in the art to which the present disclosure belongs will understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A delay control circuit, comprising:
   a delayed signal generator configured to generate an output signal by delaying an input signal in response to a delay control signal;
   a delay information generator configured to generate delay information indicating an output delay between the input signal and the output signal; and
   a delay control signal generator configured to, based on a result of a comparison between the delay information and target delay information indicating a target delay between the input signal and the output signal:
   generate the delay control signal for controlling the output delay; and
   fix the output delay at the target delay in response to the delay control signal, wherein the delay control signal generator comprises:
   a first register configured to store the target delay information;
   a second register configured to store the delay information;
   a comparator configured to generate the result of the comparison between the target delay information and the delay information; and
   a delay code generator configured to generate a delay code using the result of the comparison and a previous delay code and to output the delay code as the delay control signal.

2. The delay control circuit according to claim 1, wherein the delay control signal generator is further configured to set an initial delay between the input signal and the output signal as the target delay, wherein the initial delay is an output delay between the input signal that is initially input to the delayed signal generator and the output signal that is initially output from the delayed signal generator.

3. The delay control circuit according to claim 1, wherein the delay control signal generator is further configured to set a preset delay as the target delay.

4. The delay control circuit according to claim 1, wherein the delayed signal generator comprises:
a digital delay control circuit configured to generate a delayed signal by delaying the input signal in response to the delay control signal, wherein the delay control signal comprises a digital code; and
a clock distribution circuit configured to output the output signal by distributing the delayed signal.

5. The delay control circuit according to claim 1, wherein the delay information generator comprises:
a delay detector configured to detect the output delay and generate a delay detection signal based on the output delay, wherein the output delay is an analog signal; and
a signal converter configured to convert the delay detection signal into a digital signal and to output the digital signal as the delay information.

6. The delay control circuit according to claim 5, wherein the delay detector is further configured to generate a voltage proportional to the output delay as the delay detection signal.

7. The delay control circuit according to claim 5, wherein:
the delay detector is further configured to generate a pulse proportional to the output delay as the delay detection signal, and
the signal converter is further configured to encode data obtained by sampling the pulse and output the encoded data as the delay information.

8. The delay control circuit according to claim 1, wherein:
the first register is configured to store the target delay information in response to a first enable signal, and
the second register is configured to store the delay information in response to a second enable signal generated by inverting the first enable signal.

9. The delay control circuit according to claim 1, wherein the comparator is further configured to generate magnitude information and sign information for a difference between the target delay information and the delay information.

10. The delay control circuit according to claim 9, wherein the delay code generator comprises:
a third register configured to store the previous delay code;
a fourth register configured to store the delay code; and
a calculator configured to generate the delay code based on the previous delay code using the magnitude information and the sign information.

11. The delay control circuit according to claim 9, wherein the delay code generator comprises a code counter configured to generate the delay code by adding a preset value to or subtracting the preset value from the previous delay code depending on the sign information.

12. A memory device, comprising:
a memory cell array including a plurality of memory cells configured to store data;
a peripheral circuit configured to perform a read operation on the memory cells to read the stored data; and
a data input/output circuit configured to output the data in response to an internal clock, wherein the data input/output circuit comprises a delay control circuit configured to:
generate the internal clock by delaying an external clock that is input to the delay control circuit during the read operation; and
fix an output delay between the external clock and the internal clock at a target delay by controlling the output delay.

13. The memory device according to claim 12, wherein the delay control circuit is further configured to set an initial delay between the external clock and the internal clock as the target delay, wherein the initial delay is an output delay between the external clock that is initially input to the delay control circuit and the internal clock that is initially output from the delay control circuit.

14. The memory device according to claim 13, wherein the delay control circuit comprises:
a delayed signal generator configured to generate the internal clock based on the external clock in response to a delay control signal;
a delay information generator configured to generate delay information by converting the output delay, which is an analog signal, into a digital signal; and
a delay control signal generator configured to generate the delay control signal for controlling the output delay.

15. The memory device according to claim 14, wherein the delayed signal generator is further configured to generate a delayed signal by delaying the external clock in response to the delay control signal and to generate the internal clock by distributing the delayed signal, wherein the delay control signal comprises a digital code.

16. The memory device according to claim 14, wherein the delay information generator is further configured to generate the delay information using at least one of a voltage proportional to the output delay or a pulse proportional to the output delay.

17. The memory device according to claim 14, wherein the delay control signal generator is further configured to:
generate a delay code based on a previous delay code and a result of a comparison between target delay information, indicating the target delay, and the delay information; and
output the delay code as the delay control signal.

18. The memory device according to claim 17, wherein the delay control signal generator is further configured to generate the delay code based on the previous delay code using magnitude information and sign information for a difference between the target delay information and the delay information.

19. The memory device according to claim 18, wherein the delay control signal generator is further configured to generate the delay code by adding a preset value to or subtracting the preset value from the previous delay code depending on the sign information.

20. A method performed by a delay control circuit for fixing a delay between an output clock signal and an input clock signal, the method comprising:
receiving the input clock signal;
generating the output clock signal by delaying the input clock signal based on a delay control signal;
generating delay information, from the output clock signal and the input clock signal, indicating the delay between the output clock signal and the input clock signal;

determining target delay information from the delay information at a first time;
determining present delay information from the delay information after the first time;
generating at least one of magnitude information and sign information based on a comparison of the present delay information to the target delay information; and
generating the delay control signal from the at least one of the magnitude information and the sign information, based on comparing the present delay information to the target delay information.

21. The method according to claim 20, wherein:
the input clock signal is a read clock signal provided to the delay control circuit while a read operation is being performed; and
the output clock signal is a strobe signal.

22. The method according to claim 20, wherein:
the input clock signal is a write clock signal provided to the delay control circuit while a write operation is being performed; and
the output clock signal is a strobe signal.

23. The method according to claim 20 further comprising:
generating at least one of a pulse proportional to delay signal and a voltage proportional to delay signal based on the output clock signal and the input clock signal,
wherein the delay information is generated from the at least one of the pulse proportional to delay signal and the voltage proportional to delay signal.

* * * * *